United States Patent
Ho et al.

(10) Patent No.: US 9,892,989 B1
(45) Date of Patent: Feb. 13, 2018

(54) WAFER-LEVEL CHIP SCALE PACKAGE WITH SIDE PROTECTION

(71) Applicant: NXP B.V., Eindhoven (NL)

(72) Inventors: Chung Hsiung Ho, Kaohsiung (TW); Wen-Hsuan Lin, Kaohsiung (TW)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/373,393

(22) Filed: Dec. 8, 2016

(51) Int. Cl.
| | |
|---|---|
| *H01L 23/28* | (2006.01) |
| *H01L 23/522* | (2006.01) |
| *H01L 23/31* | (2006.01) |
| *H01L 23/00* | (2006.01) |
| *H01L 23/29* | (2006.01) |
| *H01L 21/78* | (2006.01) |
| *H01L 23/544* | (2006.01) |
| *H01L 21/56* | (2006.01) |

(52) U.S. Cl.
CPC .......... *H01L 23/3192* (2013.01); *H01L 21/56* (2013.01); *H01L 21/78* (2013.01); *H01L 23/293* (2013.01); *H01L 23/544* (2013.01); *H01L 23/562* (2013.01); *H01L 24/08* (2013.01); *H01L 2223/5446* (2013.01); *H01L 2223/54426* (2013.01); *H01L 2224/0401* (2013.01)

(58) Field of Classification Search
CPC ............. H01L 23/3121; H01L 23/3192; H01L 23/562; H01L 24/96; H01L 23/3185; H01L 23/28; H01L 2224/0401; H01L 2223/54426; H01L 23/3157; H01L 23/544; H01L 23/3171
See application file for complete search history.

(56) References Cited

U.S. PATENT DOCUMENTS

| | | | |
|---|---|---|---|
| 6,204,562 | B1 | 3/2001 | Ho et al. |
| 6,909,178 | B2 | 6/2005 | Sakamoto et al. |
| 9,117,939 | B2 | 8/2015 | Wang et al. |
| 2002/0011655 | A1* | 1/2002 | Nishiyama ............ H01L 21/561 257/688 |
| 2008/0179730 | A1 | 7/2008 | O'Donnell et al. |
| 2010/0090322 | A1* | 4/2010 | Hedler ................ H01L 23/3114 257/676 |
| 2010/0320588 | A1* | 12/2010 | Dahilig ................ H01L 21/561 257/690 |
| 2014/0091458 | A1 | 4/2014 | Van Gemert et al. |
| 2015/0125999 | A1* | 5/2015 | Lee ...................... B23K 1/0016 438/127 |
| 2015/0155264 | A1* | 6/2015 | Sridharan ............... H01L 24/83 438/113 |
| 2015/0243575 | A1* | 8/2015 | Strothmann ........ H01L 23/3114 257/773 |

* cited by examiner

*Primary Examiner* — Jasmine Clark
(74) *Attorney, Agent, or Firm* — Charles E. Bergere

(57) ABSTRACT

A semiconductor device includes a device die having a top surface, a bottom surface, and sidewalls between the top and bottom surfaces. A first protective layer covers at least the top surface and the sidewalls of the die. A thickness of the first protective layer on the sidewalls near the top surface is greater than a thickness of the first protective layer on the sidewalls die near the bottom surface.

9 Claims, 9 Drawing Sheets

US 9,892,989 B1

WAFER-LEVEL CHIP SCALE PACKAGE WITH SIDE PROTECTION

BACKGROUND

The present invention generally relates semiconductor devices, and more particularly, to wafer-level chip scale package with side protection, and a method for making such a semiconductor device.

A typical semiconductor device includes a device die and molding material that covers the device die. The molding material protects the device die from environmental stresses, such as mechanical damage, moisture, etc. Wafer-Level Chip Scale Package (WLCSP) refers to the technology of packaging an integrated circuit (IC) at the wafer level, instead of the traditional process of assembling individual dies in packages after dicing the dies from a wafer. WLCSP is an extension of the wafer fab process, where the device interconnects and protection is accomplished using the traditional fab processes and tools. In the final form, the device is a die with an array pattern of bumps or solder balls attached at an I/O pitch that is compatible with traditional circuit board assembly processes. WLCSP is a true chip-scale packaging (CSP) technology, since the resulting package is about the same size as the die. In assembling a WLCSP, molding material is deposited on the backside of a wafer and then the wafer is singulated. Thus, although the backside of the die is protected by molding material, the lateral side walls and the front side are not, such that the WLCSP device is susceptible to being damage, e.g., chipping, which may compromise the device.

Accordingly, it would be advantageous to have a semiconductor with more robust protection.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a semiconductor device including a device die having a top surface, a bottom surface, and multiple sidewalls between the top and bottom surfaces. A first protective layer covers at least the top surface and the sidewalls of the device die. A thickness of the protective layer on the sidewall near the top surface of the die is greater than a thickness of the protective layer on the sidewall near the bottom surface of the die.

In another embodiment, the present invention provides a method for assembling a semiconductor device, including cutting, in a first width, an edge of a device die from a top surface of the die towards a bottom surface of the die, where a depth of the cut is less than a thickness of the device die such that at least part of the edge of the device die near the bottom surface of the die is uncut. The method further includes cutting, in a second width less than the first width, the uncut part of the edge of the device die through the bottom surface of the die. Thus, the cut edge of the device die is stepped such that the bottom surface of the die is longer than the top surface. The method further includes covering the top surface and the edges of the die with a first protective layer.

Embodiments hereof provides protective layers on the sidewalls of the device dies to protect the device die from being damaged due to strikes from its sides.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
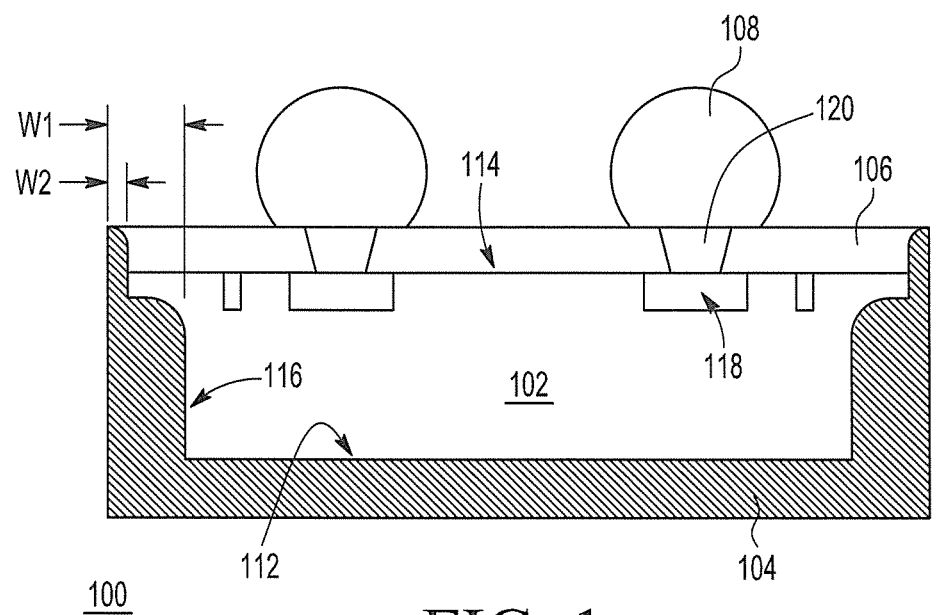
FIG. 1 is a cross-sectional side view of a semiconductor device according to a first embodiment of the present invention.

Referring now to FIG. 1, a cross-sectional side view of a semiconductor device 100 according to an embodiment of the present invention is shown. The semiconductor device 100 includes a device die 102, a first protective layer 104, a second protective layer 106, and external connectors 108.

The device die 102 has a top surface 112, a bottom (active) surface 114, and multiple sidewalls 116 that extend between the top and bottom surfaces 112 and 114. The first protective layer 104 covers the top surface 112 and the sidewalls 116. A thickness w1 of the first protective layer 104 on the sidewall 116 near the top surface 112 is greater than a thickness w2 of the first protective layer 104 on the die sidewall 116 near the die bottom surface 114 because the sidewall 116 of the device die 102 is stepped such that the bottom surface 114 has a greater length than the top surface 112. Correspondingly, the part of the first protective layer 104 adjacent the stepped sidewall 116 also is stepped. In one embodiment, the thickness w1 is about 20 µm, and the thickness w2 is about 10 µm. In an alternative embodiment, the thickness w1 is about 25 µm, and the thickness w2 is about 15 µm. A thickness of the first protective layer 104 on the top surface 112 of the device die 102 may be even larger, e.g., around 30 µm.

The second protective layer 106 covers the bottom surface 114 of the device die 102. The second protective layer 106 abuts the first protective layer 104 at the lateral sides of the device 100, such that the device die 102 is surrounded by the first protective layer 104 and the second protective layer 106. The first and second protective layers 104 and 106 together provide overall protection for the device die 102. In an optional embodiment where the semiconductor device 100 is not likely to be damaged at the bottom surface 114 because after mounting on a Printed Circuit Board (PCB) the bottom surface 114 is shielded by the PCB, the semiconductor device 100 does not require the second protective layer 106 such that the bottom surface 114 is exposed.

The device die 102 includes multiple electrical contacts or die bonding pads 118 on the bottom surface 114. The bonding pads 118 are not covered by the second protective layer 106 in order to allow for external connections to and from the device die 102. The connectors 108 are attached to the bonding pads 118. The connectors 108 may comprise solder balls, or solder balls attached to copper pillars 120, with the pillars 120 being attached to the bonding pads 118, for example.

The first and second protective layers 104 and 106 can be made of the same material such as epoxy or molding compound. Alternatively, the second protective layer 106 is made of a different material than the first protective layer 104. In the embodiment shown in FIG. 1, the first protective layer comprises a molding compound and the second protective layer comprises polyimide.

Figure 2:
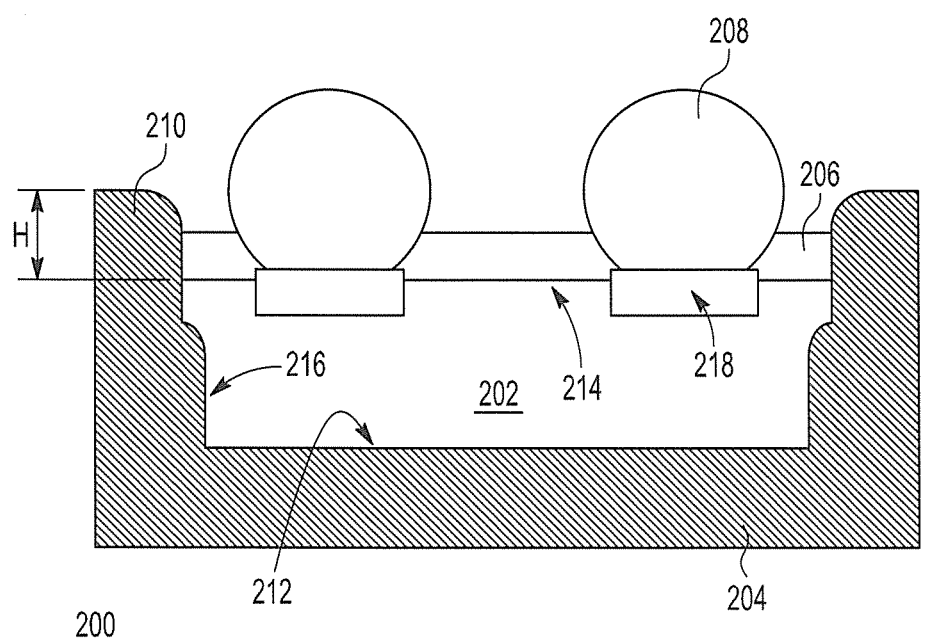
FIG. 2 is a cross-sectional side view of a semiconductor device according to a second embodiment of the present invention.

Referring to FIG. 2, a cross-sectional side view of another embodiment of a semiconductor device 200 in accordance with the present invention is shown. The device 200 is similar to the device 100, and includes a device die 202 and a first protective layer 204 covering a top surface 212 and stepped sidewalls 216 of the device die 202. The semiconductor device 200 includes a second protective layer 206 that covers a bottom (active) surface 214 of the device die 202. The first protective layer 204 on the sidewalls 216 near a corner where the sidewalls 216 meet the bottom surface 214 extends beyond the bottom surface 214 for a distance 'h', where h is preferably about 30 µm to 80 µm. Such extension of the first protective layer 204 forms a protective protrusion 210 that surrounds the bottom surface 214 of the device die 202. The thickness of the second protective layer 206 is less than the distance 'h' that the first protective layer 204 protrudes from the bottom surface of the device die 202. In this embodiment, the first and second protective layers 204 and 206 comprise molding compound. In one embodiment, the first and second protective layers 204 and 206 are formed in a single molding step such that the top surface 212, bottom surface 214 and sidewalls 216 are all covered with molding compound in a single step.

FIGS. 3A to 3I are cross-sectional side views of structures formed during assembly of a device in accordance with an embodiment of the present invention.

Figure 3A:
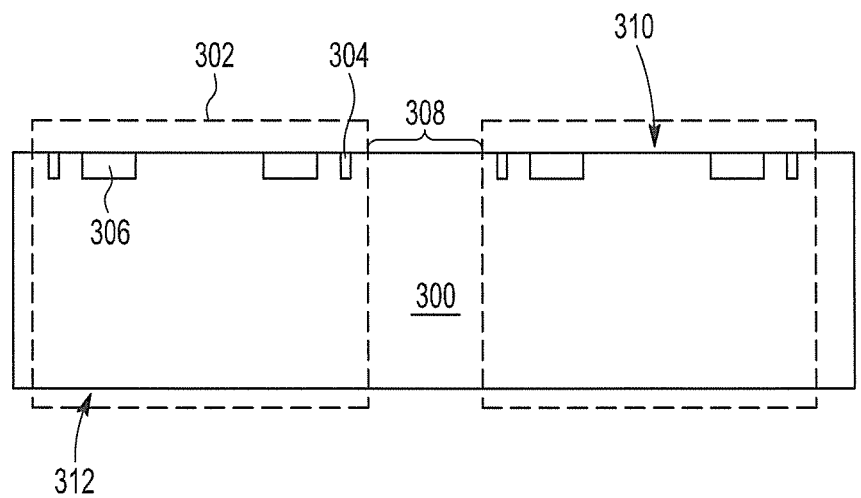
FIGS. 3A to 3I are cross-sectional side views illustrating structures formed in the steps of a method of assembling a semiconductor device according to a first embodiment of the present invention.

In the step shown in FIG. 3A, a semiconductor wafer 300 including a plurality of device dies 302 is provided. The multiple dies 302 are defined by corresponding boundary marks 304, which may be separate marks or die seal rings. The dies 302 also include at least one bonding pad 306 for providing external connection to and from the integrated circuitry internal to the die 302. The boundary marks 304 and the bonding pads 306 are formed as part of the wafer fabrication process. The bonding pad 306 typically comprises a metal such as Aluminum (Al) or Copper (Cu). Boundary marks 304 between adjacent dies 302 define saw streets 308, which are used for singulating the wafer 300 into discrete devices. A surface of the wafer 300 with the die bonding pads 306 located thereon is called herein the bottom or active surface 310, while an opposite surface thereof is called the top surface 312. The bottom surface 310 faces a PCB when a final device is mounted on and attached to a PCB.

Figure 3B:
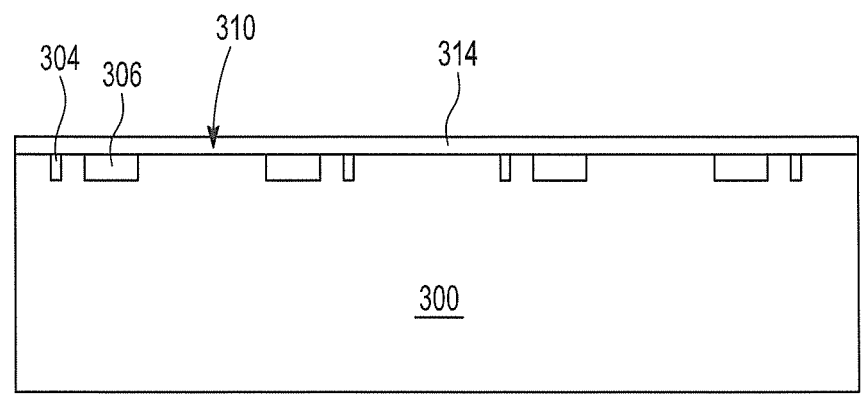

In a step illustrated in FIG. 3B, the bottom surface 310 is covered with a protective layer 314. The protective layer 314 provides protection for die bottom surface 310 and the bonding pads 306 during the ensuing packaging steps. It will be understood that because the device die 302 usually has the bonding pads 306 located near the active region thereof, the protective layer 314 can also prevent the nearby active region from being compromised. The protective layer 314 may comprises various insulation materials, such as polyimide, epoxy, etc.

Figure 3C:
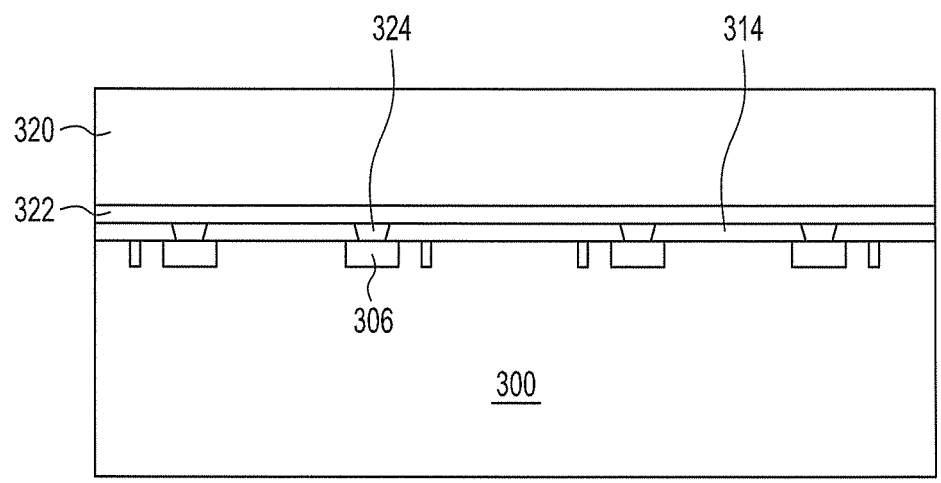

In the step shown in FIG. 3C, the wafer 300 together with the protective layer 314 is attached to a carrier 320, where the carrier 320 is attached to the protective layer 314 with an adhesive such as a double-sided adhesive tape or layer 322. The surfaces of the double-sided adhesive layer 322 are attached to the protective layer 314 and the carrier 320, respectively. Preferably the double-sided adhesive layer 322 is releasable through thermal or Ultra-Violet (UV) processes. Optionally, the adhesive layer 322 can have different release methods on each side. In one embodiment, connectors 324 are formed in the protective layer 314 and electrically connected to the die bonding pads 306. The connectors 324 can be either an extension of the bonding pads 306, built-up on the bonding pads 306, or specifically positioned in the protective layer 314 and connected to the die bonding pads 306. The connectors 324 are conductive so that signals can be passed to and from the device die 302.

Figure 3D:
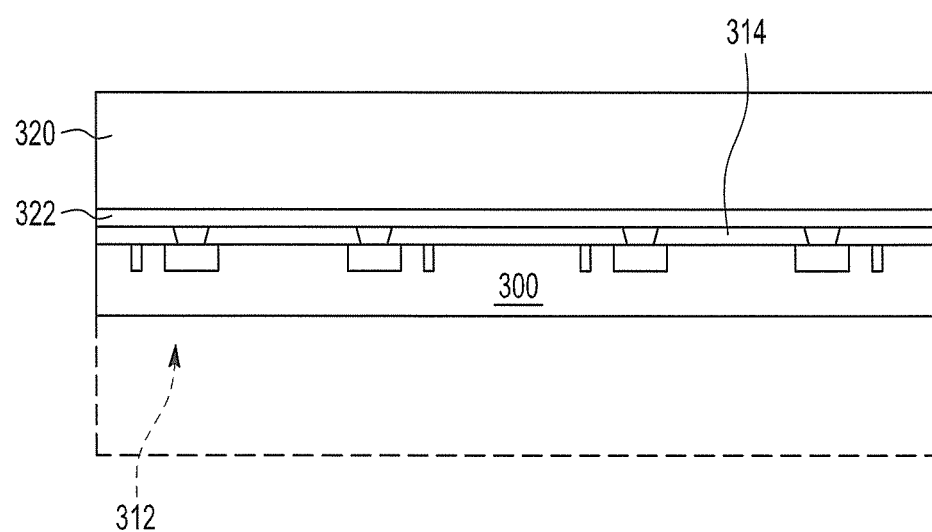

In the step shown in FIG. 3D, the wafer 300 is thinned using one or more known processes such as grinding, Chemical Mechanical Polishing (CMP), etc. In one embodiment, the wafer 300 has a thickness of around 775 µm, and after the thinning step of FIG. 3D, the thickness is reduced to around 50 µm to 100 µm. The top surface 312 of the wafer 300 is thinned, which means after thinning, the top surface 312 is moved, as indicated by the dotted lines shown in FIG. 3D.

Figure 3E:
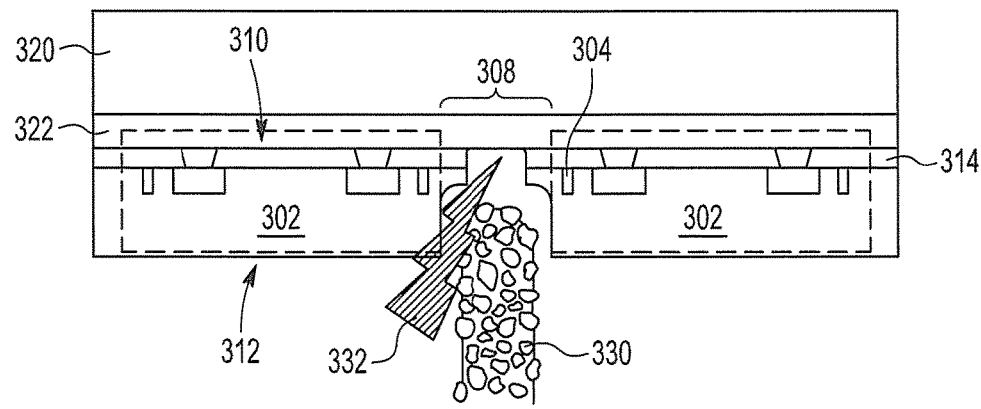

In FIG. 3E, a singulation process is shown. The thinned wafer 300 is first cut along the saw streets 308 using a first saw blade 330 from the top surface 312 towards the bottom surface 310, but stops before reaching the bottom surface 310. In one embodiment, the first cut has a depth of between 70-80% of the thickness of the wafer 300. The first saw blade 330 has a first width. Although the first cut is preferred to be done with a saw, it will be understood by those of skill in the art that other wafer cutting methods and tools may be used. The saw blade 330 has a width or kerf that is less than a width of the saw street 308, and in one embodiment, the first saw blade 330 has a kerf of 80 µm.

A second cut 332 is then performed, cutting through the remaining thickness of the wafer 300. The second cut 332 has a second width that is less than the first width. In one embodiment, the width of the second cut 332 is about 60 µm. In one embodiment, the second cut 332 stops upon reaching the protective layer 314, and in another embodiment, the second cut 332 goes at least partially through the protective layer 314, but stops at the double-sided adhesive layer 322. However, in yet another embodiment, the second cut 332 goes through the double-sided adhesive layer 322 to the carrier 320. The carrier 320 may include a trench to accommodate the second cut 332. Due to making the first and second cuts of different widths, the sides of the singulated dies 302 have a stepped profile, with a length of the bottom surface 310 being longer than a length of the top surface 312.

The second cut 332 preferably is performed using a laser so that excess material, e.g. silicon, of the wafer 300, and the cut through portion of the protective layer 314 are removed. In applications where the protective layer 314 is made of polyimide, if a saw blade is used to make the second cut 332, the polyimide material will attach to the blade and hinder the cutting, thus, laser cutting is preferred for the second cut 332.

Figure 3F:
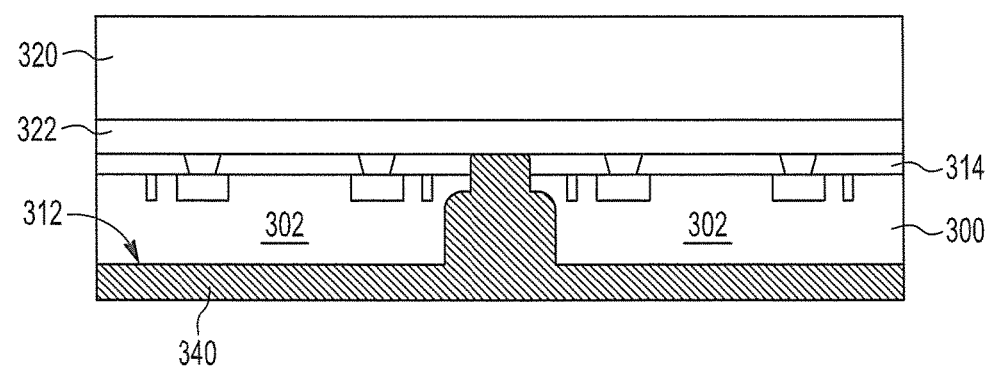

In the step shown in FIG. 3F, another protective layer 340, hereinafter referred to as the first protective layer, is formed over the top 312 and side surfaces of the dies 302 to cover the stepped edges thereof. The stepped gaps between neighboring dies 302, and optionally the trenches in the carrier 320, the adhesive layer 322, and the other protective layer 314 are filled with molding material such that the sidewalls of the device dies 302 and the cut surface of the protective layer 314 are covered by the first protective layer 340. In the presently preferred embodiment, the first protective layer 340 comprises a molding compound or insulation material, as is typically used in semiconductor device assembly. The first protective layer 340 protects the die 302 from being damaged such as mechanically or by moisture or dust, etc.

Figure 3G:
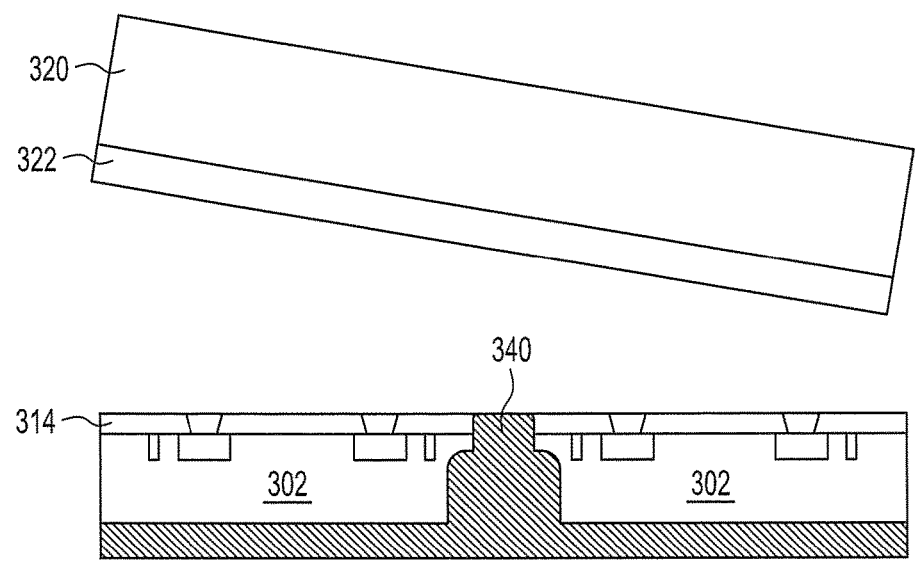

In FIG. 3G, a step of removing the adhesive layer 322 and the carrier 320 is illustrated, leaving the protective layers 314 and 340 exposed. As described above, the double-sided adhesive layer 322 is releasable through thermal or UV processes, so when the adhesive layer 322 is subjected to heat or UV radiation, then the adhesive layer 322 is separated from the protective layer 314.

Figure 3H:
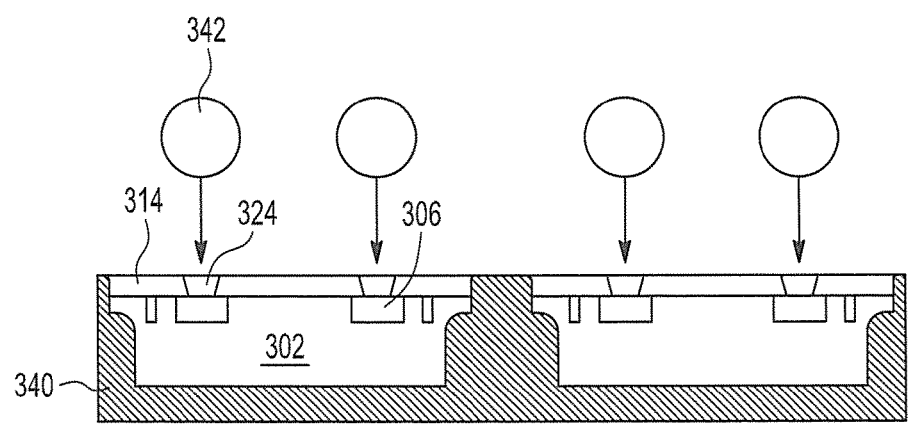

Optionally, referring to FIG. 3H, conductive balls 342 may be mounted on the connectors 324. In other embodiments, the conductive balls 342 directly contact the die bonding pads without the need for connectors 324. The conductive balls 342 may comprises different shapes, sizes and materials in order to allow the die 302 to receive and transmit signals to circuitry external to the die 302.

Figure 3I:
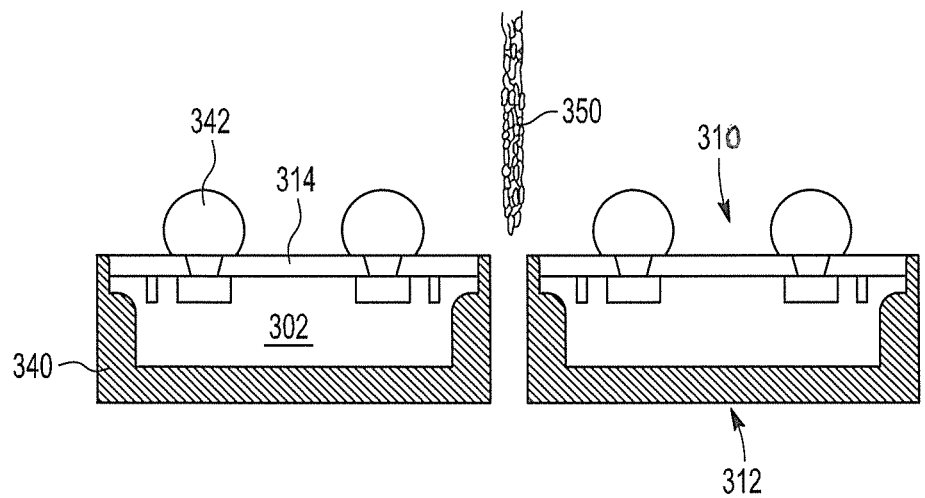

The processed wafer 300 is then cut 350, preferably from the bottom surface 310 towards the top surface 312 to separate the simultaneously formed devices, as shown in FIG. 3I. The cut 350 can be performed using a blade with the cut 350 being along the saw street 308 but now cutting only through the molding material of the first protective layer 340 proximate the edges of the dies 302. After the cut 350, as shown in FIG. 3I, the top 312 and side surfaces of the dies 302 are covered by the first protective layer 340. A width of the cut 350 is such that the cut 350 is within the saw street 308 and leaves the first protective layer 340 along the sides of the dies 302. In one embodiment, a width of the cut 350 is about 30 µm. As a result, the thickness of the first protective layer 340 on the sides and bottom surface 310 is about 15 µm, while the thickness of the first protective layer 340 on the die top surface 312 is about 25 µm.

The cut 350 can be performed at perpendicular edges of the device dies 302, thereby singulating the device dies 302 into separate semiconductor devices as shown in FIG. 1. The device die 302 is surrounded by the first protective layer 340 and the (second) protective layer 314. The semiconductor device thus obtained is protected at the sides, top and bottom surfaces and is not easily damaged.

FIGS. 4A to 4F are cross-sectional side views of structures formed during the assembly of a semiconductor device according to another embodiment of the present invention. Steps in this embodiment that are similar to that of the previous embodiment will not be described in duplicative detail.

Figure 4A:
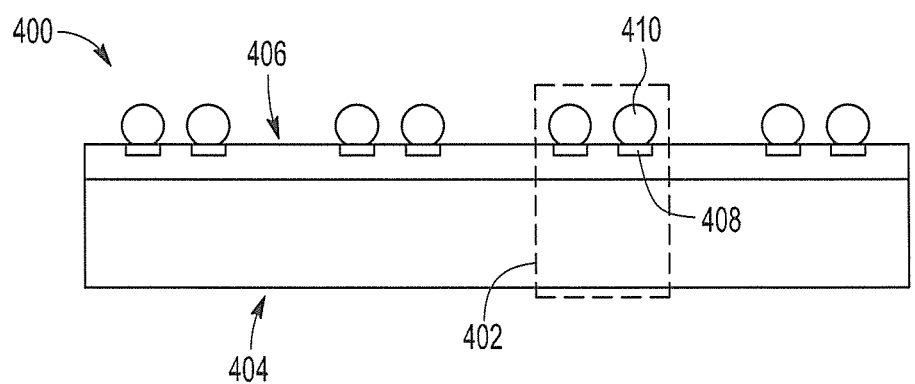
FIGS. 4A to 4G are cross-sectional side views illustrating structures formed in the steps of a method of assembling a semiconductor device according to a second embodiment of the present invention.

A wafer 400 is provided in FIG. 4A. The wafer 400 comprises a plurality of device dies 402 and has a top surface 404 and a bottom (active) surface 406. Each of the device dies 402 includes two or more bonding pads 408 for allowing external circuitry to communicate with the circuitry internal to the die 402. Conductive balls 410 are attached to the bonding pads 408 to facilitate connection of the dies to a PCB.

Figure 4B:
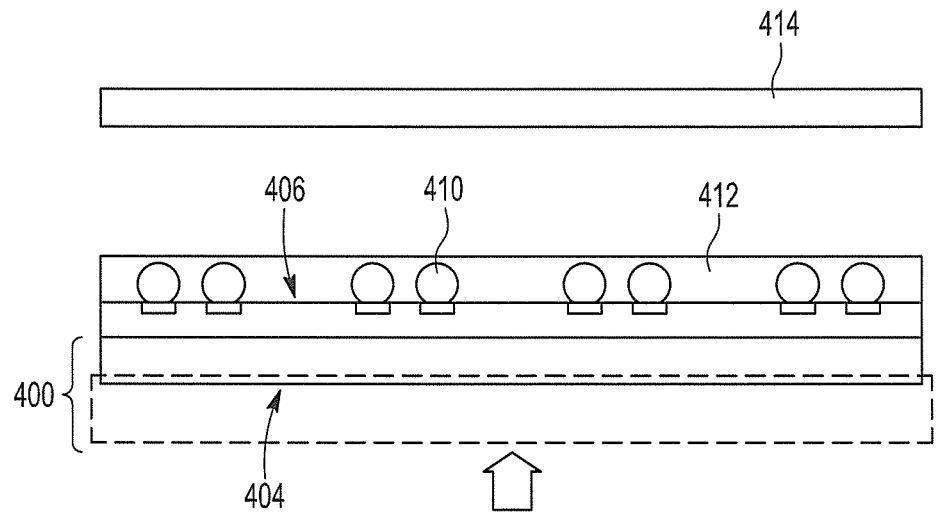

FIG. 4B illustrates the wafer 400 being then thinned by, for example, grinding or cutting the top surface 404, as indicated by the large arrow and the dashed lines, which indicate the outline of the wafer 400 before thinning. The thinning of the wafer 400 is similar to the step shown and described with reference to FIG. 3D, and will not be described in detail here.

FIG. 4B also illustrates a double-sided adhesive layer 412 being placed over the bottom surface 406 of the wafer 400 such that the adhesive layer 412 covers the bottom surface 406 and the conductive balls 410. This sub-assembly will then be attached to a carrier 414, with the adhesive layer 412 securing the sub-assembly to the carrier.

Figure 4C:
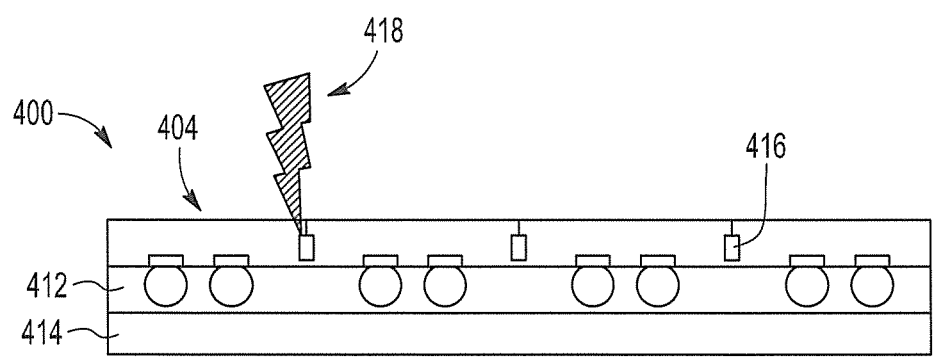

FIG. 4C illustrates a laser marking step, where the die top side 414 is marked to indicate the locations of the saw streets that extend along the wafer 400 and between the dies 402. In FIG. 4C, the sub-assembly is flipped-over and using infrared inspection, the die seal rings/boundary markers 416 are located and then a laser 418 is used to make marks in the die top surface that are in alignment with the boundary markers 416, which indicate the locations of the saw streets. This same IR inspection and laser marking process can be used to mark the wafer 300 shown in FIG. 3E too.

Figure 4D:
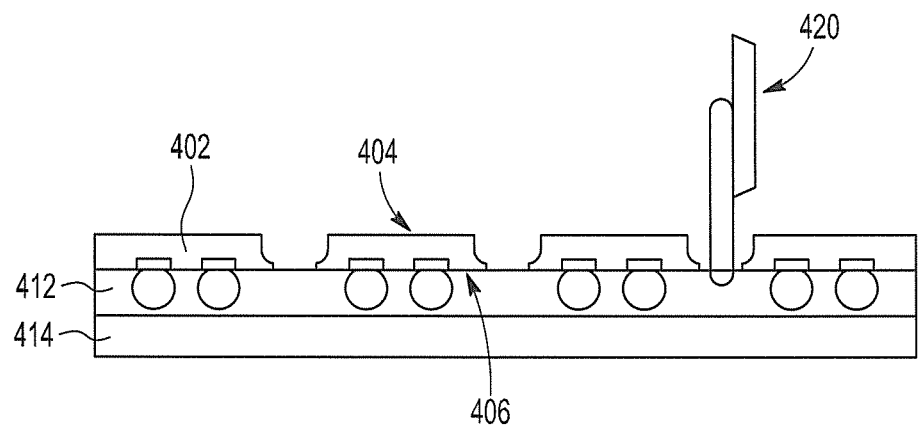

FIG. 4D illustrates the sub-assembly from FIG. 4C being cut with a saw blade 420. Actually, first and second cuts are made in the saw streets, from the wafer top surface 404, using first a thicker saw blade to a depth of about 60-80% of the thickness of the wafer 400 followed by a second cut with a thinner saw blade the rest of the way through the wafer 400, as was shown in and described with reference to FIG. 3E. The first and second cuts form a stepped profile, also like that shown and described above with reference to FIG. 3E. It will be understood that the second cut in the current embodiment does not need to be implemented with a laser since there is no second protective layer (i.e., protective layer 314 shown in FIG. 3E covering the bottom surface 310 of the dies 302). The second cut of the current embodiment goes into the double-sided adhesive layer 412. Accordingly, the double-side adhesive layer 412 has trenches corresponding to each second cut.

Figure 4E:
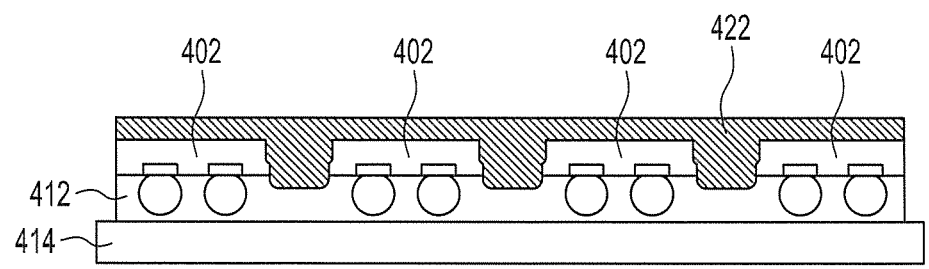

FIG. 4E shows a step of molding the assembly such that molding material 422 fills the stepped-grooves (formed by the cutting 420) between neighboring device dies 402. The molding material 422 extends into the trench in the adhesive layer 412. The molding material 422 thus covers and extends beyond the edges of the device dies 402, and thus forms the first protective layer 422 (204 in FIG. 2). This molding step is similar to the step shown in FIG. 3F.

Figure 4F:
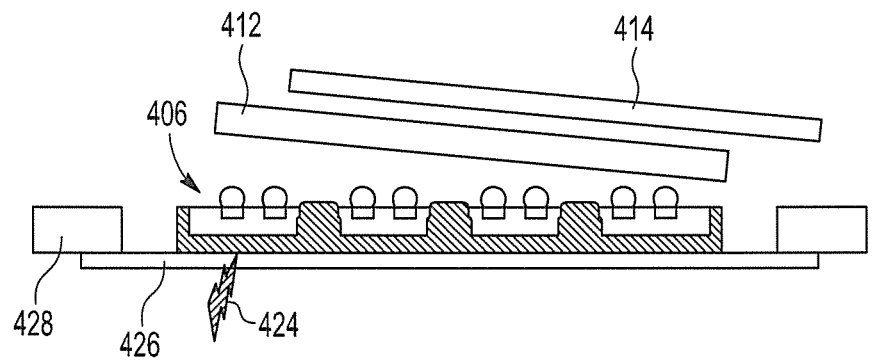

FIG. 4F illustrates a step of heating or exposing to UV radiation 424 the assembly to remove the double-sided adhesive layer 412 and the carrier 414 from the bottom surface 406 of the wafer 400. Removal of the adhesive layer 412 and the carriers 414 are similar to steps described above with reference to FIG. 3G. The molded assembly is flipped-over, and then a top surface of the molded assembly is mounted on a dicing tape 426, which is operably coupled to a mechanical driver 428. The dicing tape 426 is elastic and the mechanical driver 428 is coupled to both of its ends.

Figure 4G:
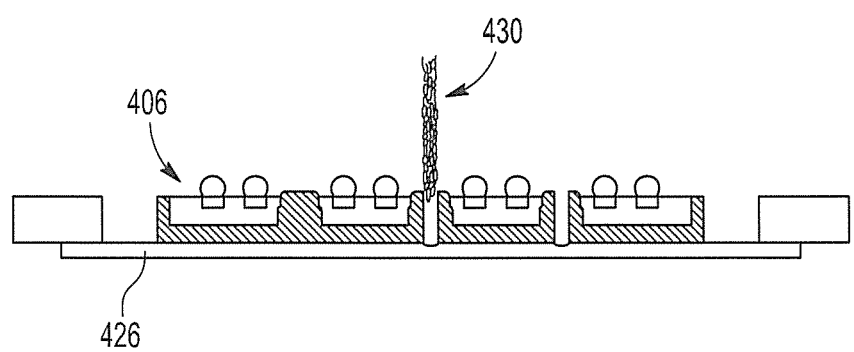

FIG. 4G illustrates the assembly being singulated using a saw 430. The assembly is sawed between neighboring device dies 402, with the saw blade 430 cutting through the molding material 422 from the bottom surface 406 through to the dicing tape 426. The sawing is similar to the step described with reference to FIG. 3I. The mechanical driver 428 pulls the dicing tape 426 at its far ends to enlarge the gap between molded device dies 402, which separates the molded dies 402 and allows them to be picked up by a pick and place machine (not shown).

The first protective layer 422 covers the stepped sidewalls of the device dies 402 and extends on the sidewalls from the top surface 404 to the bottom surface 406, and even protrudes a bit past the bottom surface 406 to provide protective protrusions at corners where the sidewalls meet the bottom surface 406. The semiconductor devices are protected from being damaged by mechanical force at the side of the devices. Further, with the protective protrusions and the second protective layer (206 in FIG. 2) on the bottom surface of the semiconductor device, the protection is more complete.

It will be understood that the described "lower" or "higher" threshold voltage is expressed in order to show the relative relationship between the threshold voltages. In optional embodiments, an inverter circuit can be configured where one of the transistors has a high threshold voltage while another one of the transistors has a normal or only relatively lower threshold voltage in order to show a lowered threshold voltage. In other optional embodiments, one of the transistors can be configured to be normal while the other one thereof has a lowered threshold voltage. A transistor with a lowered VT enables smaller size and in turn reduces the overall circuit size, as well as quicker response and lower dynamic power consumption.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A semiconductor device, comprising:
    a device die having a top surface, a bottom surface, and multiple sidewalls between the top surface and the bottom surface, wherein the sidewalls are stepped such that the bottom surface of the device die is longer than the top surface of the device die; and
    a first protective layer covering at least the top surface and the sidewalls of the device die,
    wherein a thickness of the first protective layer on the sidewalls near the top surface is greater than a thickness of the first protective layer on the sidewalls near the bottom surface.

2. The semiconductor device of claim 1, further comprising a second protective layer covering the bottom surface of the device die.

3. The semiconductor device of claim 2, wherein the device die comprises at least one die bonding pad formed on the bottom surface, wherein the at least one die bonding pad is not covered by the second protective layer.

4. The semiconductor device of claim 3, further comprising at least one connector corresponding to the at least one die bonding pad, wherein the at least one connector extends through the second protective layer and is connected with the at least one die bonding pad.

5. The semiconductor device of claim 2, wherein the second protective layer is made of polyimide.

6. The semiconductor device of claim 2, wherein the first and second protective layers comprise the same material.

7. The semiconductor device of claim 1, wherein the first protective layer on the sidewalls near corners where the sidewalls meet the bottom surface extends over the bottom surface and form protrusions that surround the bottom surface.

8. The semiconductor device of claim 7, further comprising a second protective layer covering the bottom surface of the device die, wherein the second protective layer is surrounded by the protective protrusions.

9. The semiconductor device of claim 8, wherein a thickness of the second protective layer is less than a height that the protective protrusions extend over the bottom surface of the device die.

* * * * *